(12) United States Patent
Yu et al.

(10) Patent No.: US 11,248,142 B2
(45) Date of Patent: Feb. 15, 2022

(54) ENCAPSULATING COMPOSITION

(71) Applicant: LG CHEM, LTD., Seoul (KR)

(72) Inventors: Mi Lim Yu, Daejeon (KR); Joon Hyung Kim, Daejeon (KR); Yu Jin Woo, Daejeon (KR); Kook Hyun Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 227 days.

(21) Appl. No.: 16/467,435

(22) PCT Filed: Dec. 11, 2017

(86) PCT No.: PCT/KR2017/014482
§ 371 (c)(1),
(2) Date: Jun. 6, 2019

(87) PCT Pub. No.: WO2018/106090
PCT Pub. Date: Jun. 14, 2018

(65) Prior Publication Data
US 2019/0300746 A1 Oct. 3, 2019

(30) Foreign Application Priority Data
Dec. 9, 2016 (KR) .................... 10-2016-0167796

(51) Int. Cl.
*C09D 163/00* (2006.01)
*C08G 59/22* (2006.01)
(Continued)

(52) U.S. Cl.
CPC ......... *C09D 163/00* (2013.01); *C08G 59/226* (2013.01); *C08G 59/24* (2013.01);
(Continued)

(58) Field of Classification Search
CPC .. C09D 163/00; C09D 11/101; C08G 59/226; C08G 59/24; C08L 63/00; H01L 51/0001;
(Continued)

(56) References Cited

U.S. PATENT DOCUMENTS 10,336,917 B2 7/2019 Cho et al.
2014/0072731 A1* 3/2014 Seo .................. C08G 65/20
428/1.53

FOREIGN PATENT DOCUMENTS

JP 2009030058 A 2/2009
JP 2009-098187 A 5/2009
(Continued)

OTHER PUBLICATIONS

Daicel Corporation Organic Chemical Products Company, Celloxide 2021P Cycloaliphatic Epoxide, Product Data Sheet, Document No. 20140251 (cited in the Japanese office action in Application No. 2019-529833 by JPO dated Jan. 4, 2021).
(Continued)

*Primary Examiner* — Ling Siu Choi
*Assistant Examiner* — Ronald Grinsted
(74) *Attorney, Agent, or Firm* — Detons US LLP (57) ABSTRACT

The present application relates to an encapsulating composition and an organic electronic device comprising the same, and provides an encapsulating composition which can effectively block moisture or oxygen introduced into an organic electronic device from the outside to secure the lifetime of the organic electronic device, is possible to realize a top emission type organic electronic device, is applicable to an inkjet method and can provide a thin display.

20 Claims, 1 Drawing Sheet

(51) Int. Cl.
    *C08G 59/24*     (2006.01)
    *C08L 63/00*     (2006.01)
    *C09D 11/101*     (2014.01)
    *H01L 51/00*     (2006.01)
    *H01L 51/52*     (2006.01)

(52) U.S. Cl.
    CPC ............ *C08L 63/00* (2013.01); *C09D 11/101* (2013.01); *H01L 51/0001* (2013.01); *H01L 51/0035* (2013.01); *H01L 51/52* (2013.01); *H01L 51/5253* (2013.01)

(58) Field of Classification Search
    CPC .. H01L 51/0035; H01L 51/52; H01L 51/5253
    USPC .......................................................... 257/40
    See application file for complete search history.

(56) References Cited

FOREIGN PATENT DOCUMENTS

| | | |
|---|---|---|
| JP | 2010163566 A | 7/2010 |
| JP | 2010-184960 A | 8/2010 |
| JP | 2010-280876 A | 12/2010 |
| JP | 2012-131989 A | 7/2012 |
| JP | 2013-091676 A | 5/2013 |
| JP | 2013-109838 A | 6/2013 |
| JP | 2013-170238 A | 9/2013 |
| JP | 2014500984 A | 1/2014 |
| JP | 2014-095053 A | 5/2014 |
| JP | 2014105286 A | 6/2014 |
| JP | 2016-104888 A | 6/2016 |
| JP | 2016527362 A | 9/2016 |
| JP | 2016530364 A | 9/2016 |
| JP | 2019526690 A | 9/2019 |
| JP | 2019526691 A | 9/2019 |
| JP | 2019528355 A | 10/2019 |
| KR | 10-2005-0067152 A | 6/2005 |
| KR | 10-2008-0058062 A | 6/2008 |
| KR | 10-2009-011656 A | 2/2009 |
| KR | 10-2011-0106227 A | 9/2011 |
| KR | 10-2013-0040725 A | 4/2013 |
| KR | 20130040725 A * | 4/2013 ............ C08L 63/00 |
| KR | 10-2015-0090059 A | 8/2015 |
| KR | 10-2015-0090063 A | 8/2015 |
| TW | 2015-00396 A | 1/2015 |
| WO | 2014083850 A1 | 6/2014 |
| WO | 2015005210 A1 | 1/2015 |
| WO | 2015068454 A1 | 5/2015 |
| WO | 2015129670 A1 | 9/2015 |

OTHER PUBLICATIONS

Daicel Celloxide 2021P, Product Data Sheet, Document No. 20140251, Daicel Corporation, Organic Chemical Products Company, Mar. 26, 2020.

* cited by examiner

ENCAPSULATING COMPOSITION

CROSS-REFERENCE TO RELATED APPLICATIONS

This application is a National Stage Entry of International Application No. PCT/KR2017/014482, filed on Dec. 11, 2017, and claims the benefit of and priority to Korean Application No. 10-2016-0167796, filed on Dec. 9, 2016, all of which are hereby incorporated by reference in their entirety for all purposes as if fully set forth herein.

TECHNICAL FIELD

The present application relates to an encapsulating composition, an organic electronic device comprising the same, and a method for manufacturing the organic electronic device.

BACKGROUND ART

An organic electronic device (OED) means a device comprising a layer of an organic material that generates an alternating current of electric charges using holes and electrons, and an example thereof may include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an encapsulating composition which can effectively block moisture or oxygen introduced into an organic electronic device from the outside to secure the lifetime of the organic electronic device, is possible to realize a top emission type organic electronic device, is applicable to an inkjet method and can provide a thin display, and an organic electronic device comprising the same.

Specifically, the present application relates to an encapsulating composition for sealing an organic electronic element which is applicable to an inkjet process, wherein the composition may be designed to have appropriate physical properties when it has been discharged onto a substrate using inkjet printing capable of non-contact patterning. In the present application, a monofunctional compound has been used for realizing the above physical properties, where the monofunctional compound has excellent spreadability when applied by an ink jet method, whereas it causes a problem of lowering adhesion properties after curing and optical characteristics by no reaction or over curing. Accordingly, the present application is intended to realize spreadability, durability reliability after curing, and optical characteristics together by comprising other curable compounds having bifunctionality or more.

Technical Solution

The present application relates to an encapsulating composition. The encapsulating composition may be a sealing material applied to sealing or encapsulating an organic electronic device such as, for example, an OLED. In one example, the encapsulating composition of the present application can be applied to sealing or encapsulating the entire surface of an organic electronic element. Thus, after the encapsulating composition is applied to the encapsulation, it may be present in an organic layer form sealing the entire surface of the organic electronic element. In addition, the organic layer may be laminated on the organic electronic element together with a protective layer and/or an inorganic layer, which is described below, to form a sealing structure.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

An exemplary encapsulating composition may comprise a curable compound. More specifically, the encapsulating composition of the present application may comprise a curable compound having a cyclic structure in its molecular structure and having at least two or more curable functional groups and a monofunctional curable compound. The monofunctional curable compound may be comprised in the composition in a range of 65 to 165 parts by weight, 68 to 162 parts by weight, 73 to 160 parts by weight, 78 to 159 parts by weight, 85 to 158 parts by weight or 90 to 157 parts by weight, relative to 100 parts by weight of the curable compound having a cyclic structure. In this specification, the term "part by weight" herein may mean a weight ratio between the respective components. Furthermore, the encapsulating composition of the present application may have a haze of 3% or less, 2% or less or 1% or less according to JIS K7105 standard test after curing, and the lower limit is not particularly limited, but may be 0% or 0.01%. Within the haze range, the encapsulating composition may have excellent optical properties after curing. In addition, by controlling the content ratio of the monofunctional curable compound and the curable compound having a cyclic structure, the present application allows for the cured product after curing by being applied on the organic electronic element to have excellent curing sensitivity, curing strength and surface strength, while making it possible to provide a composition capable of an inkjet process.

In this specification, the curable compound may be collectively referred to as a compound having a curable functional group. The curable compound may comprise, for example, the curable compound having a cyclic structure in its molecular structure and the monofunctional curable compound, as described above, and may comprise a linear or branched aliphatic curable compound and/or a curable compound having an oxetane group, as described below.

In one example, the encapsulating composition may further comprise a linear or branched aliphatic curable compound. The aliphatic curable compound may have at least two or more curable functional groups. Also, the linear or branched aliphatic compound may be comprised in the encapsulating composition in a range of 20 parts by weight or more, less than 205 parts by weight, 23 parts by weight to 204 parts by weight, 30 parts by weight to 203 parts by weight, 34 parts by weight to 202 parts by weight, 40 parts by weight to 201 parts by weight, 60 parts by weight to 200 parts by weight or 100 parts by weight to 173 parts by weight, relative to 100 parts by weight of the compound having a cyclic structure. By controlling the content ratio of the curable compound having a cyclic structure and the aliphatic curable compound, the present application can prevent haze occurrence due to no reaction or over curing to realize optical characteristics, prevent damage of an organic electronic element due to the nature of an organic layer composition that is directly applied on the element and control the physical properties so that it can be applied on the element by the inkjet method.

In one example, the curable compound may be an epoxy compound, and when the compound is an epoxy compound, the curable compound having a cyclic structure may have an epoxy equivalent in a range of 50 to 350 g/eq, 73 to 332 g/eq, 94 to 318 g/eq or 123 to 298 g/eq. Also, the linear or branched aliphatic compound may have an epoxy equivalent in a range of 120 e/eq to 375 e/eq or 120 e/eq to 250 e/eq. By controlling the epoxy equivalent of the curable compound to be low, the present application can prevent the viscosity of the composition from becoming excessively high to render the inkjet process impossible, while improving the curing completion degree after curing of the sealing material, and simultaneously provide moisture barrier properties and excellent curing sensitivity. In this specification, the epoxy equivalent is grams (g/eq) of a resin containing one gram equivalent of epoxy group, which can be measured according to the method defined in JIS K 7236.

In an embodiment of the present application, the encapsulating composition may further comprise a curable compound having an oxetane group. The curable compound having an oxetane group may have at least two or more oxetane groups. The curable compound having an oxetane group may be comprised in an amount of 50 to 150 parts by weight, 55 to 145 parts by weight, 60 to 140 parts by weight, 65 to 140 parts by weight, 70 to 135 parts by weight, 75 to 130 parts by weight, 80 to 125 parts by weight, 85 to 120 parts by weight or 88 to 115 parts by weight, relative to 100 parts by weight of the curable compound having a cyclic structure and the monofunctional curable compound. By controlling the content ratio between the curable compounds, the present application can form an organic layer on an organic electronic element by an inkjet method, and the applied encapsulating composition can provide an organic layer which has excellent spreadability in a short time and has excellent curing strength after being cured.

The compound having an oxetane group may have a weight average molecular weight in a range of 150 to 1,000 g/mol, 173 to 980 g/mol, 188 to 860 g/mol, 210 to 823 g/mol or 330 to 780 g/mol. By controlling the weight average molecular weight of the compound having an oxetane group to be low, the present application can realize excellent printability when applied to inkjet printing and simultaneously provide moisture barrier property and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time.

The compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point may be measured at 1 atm, unless otherwise specified.

In one example, the encapsulating composition of the present application may have a contact angle to glass of 30° or less, 25° or less, 20° or less, 15° or less, or 12° or less. The lower limit is not particularly limited, but may be 10 or 3° or more. By adjusting the contact angle to 300 or less, the present application can ensure spreadability in a short time in the inkjet coating, thereby forming an organic layer of a thin film. In the present application, the contact angle may be measured by applying a drop of the encapsulating composition onto glass using a sessile drop measurement method, which may be an average value measured after applying 5 times.

In the present application, the curable functional group of the above-mentioned curable compound may be, for example, one or more selected from an oxetane group, a glycidyl group, an isocyanate group, a hydroxyl group, a carboxyl group, an amide group, an epoxide group, a sulfide group, an acetal group and a lactone group.

In an embodiment of the present application, the encapsulating composition may comprise a compound having a cyclic structure in its molecular structure as a curable compound, as described above. In one example, the compound having a cyclic structure in the molecular structure may have ring constituent atoms in the molecular structure in a range of 3 to 10, 4 to 8, or 5 to 7, and one or two or more, or 10 or less of the cyclic structures may be present in the compound. The compound having a cyclic structure may be comprised in an amount of 10 to 50 parts by weight, 12 to 45 parts by weight, 14 to 40 parts by weight, 15 to 35 parts by weight, 16 to 28 parts by weight or 16 to 22 parts by weight, relative to 100 parts by weight of the entire curable compound. By controlling the content range, the present application makes it possible to provide an encapsulating composition with suitable physical properties in top sealing the organic electronic element, to have excellent curing strength after curing, and to realize excellent moisture barrier properties together.

In one example, the compound having a cyclic structure in its molecular structure may be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In this specification, the curable compound having a cyclic structure may be an aliphatic compound, which may be distinguished from the linear or branched aliphatic compound in that it has a cyclic structure. Also, the curable compound having an oxetane group may be a linear, branched or cyclic aliphatic compound, but it may be distinguished from the two compounds mentioned above in that it has an oxetane group. Furthermore, the monofunctional curable compound is a compound having one curable functional group, which may be distinguished from the above three compounds.

In one example, the structure of the curable compound comprising the oxetane group is not limited as long as it has the functional group, and for example, OXT-121, CHOX, OX-SC, OXT101, OXT121, OXT221 or OXT212 from TOAGOSEI, or EHO, OXBP, OXTP or OXMA from ETERNACOLL may be exemplified. Also, the linear or branched aliphatic curable compound may include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto. Furthermore, the monofunctional curable compound may comprise a glycidyl ether compound as an aliphatic alcohol, or glycidyl ester as an alkyl carboxylic acid.

In an embodiment of the present application, the encapsulating composition may further comprise a surfactant. In one example, the surfactant may comprise a polar functional group, and the polar functional group may be present at the compound structural end of the surfactant. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the above-mentioned curable compound to provide excellent coating properties on the organic electronic element. On the other hand, in the case of a surfactant comprising a polar reactive group, it may have high affinity with the other components of the encapsulating composition, thereby realizing an excellent effect in terms of adhesion. In an embodiment of the present application, a hydrophilic fluorine-based surfactant or non-silicone-based surfactant may be used to improve coating properties of a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F552, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be included in an amount of 0.01 to 10 parts by weight, 0.05 to 10 parts by weight, 0.1 to 10 parts by weight, 0.5 to 8 parts by weight, or 1 to 4 parts by weight, relative to 100 parts by weight of the entire curable compound. Within the content range, the present application makes it possible that the encapsulating composition is applied to an inkjet method to form an organic layer of a thin film.

In an embodiment of the present application, the encapsulating composition may further comprise a photoinitiator. The photoinitiator may be an ionic photoinitiator. Also, the photoinitiator may be a compound absorbing a wavelength in a range of 200 nm to 400 nm. By using the photoinitiator, the present application can realize excellent curing properties in a specific composition of the present application.

In one example, the photoinitiator may be a cationic photopolymerization initiator. As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. Diaryliodonium salt, triarylsulfonium salt or aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethyl-benzoin sulfonate and the like can be exemplified as the initiator of the latent sulfuric acid series, without being limited thereto.

In one example, the encapsulating composition of the present application may comprise a photoinitiator comprising a sulfonium salt as the photoinitiator in the above-mentioned specific composition, so as to be suitable for a use sealing an organic electronic element by an inkjet method. Even if the encapsulating composition according to the above composition is directly sealed on the organic electronic element, it can prevent chemical damage from being applied to the element due to a small amount of generated outgas. Furthermore, the photoinitiator comprising a sulfonium salt may also have excellent solubility, thereby being suitably applied to an inkjet process.

In an embodiment of the present application, the photoinitiator may be present in an amount of 1 to 15 parts by weight, 2 to 13 parts by weight or 3 to 11 parts by weight, relative to 100 parts by weight of the entire curable compound. By controlling the photoinitiator content range, due to the nature of the composition that is directly applied on an organic electronic element, the present application can minimize physical and chemical damage to the element.

In an embodiment of the present application, the encapsulating composition may further comprise a photosensitizer in order to complement the curing property at a long wavelength activation energy beam of 300 nm or more. The photosensitizer may be a compound that absorbs a wavelength in a range of 200 nm to 400 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin and 10,10-carbonylbis[1,1,7,7-tetramethyl-2,3,6,7-tetrahydro-1H,5H, 11H-Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer may be included in a range of 28 to 40 parts by weight, 31 to 38 parts by weight or 32 to 36 parts by weight, relative to 100 parts by weight of the photoinitiator. By controlling the content of the photosensitizer, the present invention can realize a synergistic action of curing sensitivity at a desired wavelength, and also prevent the photosensitizer from lowering the adhesive force by not dissolving.

The encapsulating composition of the present application may further comprise a coupling agent. The present application can improve adhesiveness of a cured product of the encapsulating composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent may be included in an amount of 0.1 to 10 parts by weight or 0.5 to 5 parts by weight, relative to 100 parts by weight of the entire curable compound. Within the above range, the present application can realize an effect of improving the adhesiveness by the addition of the coupling agent.

The encapsulating composition of the present application may comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which may include, for example, one or a mixture of two or more of a metal oxide, a metal salt or phosphorus pentoxide ($P_2O_5$), and the like, in the case of a moisture-reactive adsorbent, and may include zeolite, zirconia or montmorillonite, and the like, in the case of the physical adsorbent.

The encapsulating composition of the present application may comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the entire curable compound. As the encapsulating composition of the present application preferably controls the content of the moisture adsorbent to 5 parts by weight or more, the present application can make the encapsulating composition or the cured product thereof exhibit excellent moisture and humidity barrier properties. In addition, by controlling the content of the moisture adsorbent to 100 parts by weight or less, the present application can provide a thin film sealing structure.

In one example, the encapsulating composition may further comprise an inorganic filler, if necessary. The specific type of the usable filler in the present application is not particularly limited, and for example, one or a mixture of two or more of clay, talc, alumina, calcium carbonate, silica, and the like may be used.

The encapsulating composition of the present application may comprise 0 to 50 parts by weight, 1 to 40 parts by weight, 1 to 20 parts by weight, or 1 to 10 parts by weight of inorganic filler, relative to 100 parts by weight of the entire curable compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the encapsulating composition according to the present application may comprise various additives in the range without affecting the above-described effects of invention. For example, the encapsulating composition may comprise a defoamer, a tackifier, an ultraviolet stabilizer or an antioxidant and the like in an appropriate range of content depending on the desired physical properties.

In one example, the encapsulating composition may be in a liquid phase at room temperature, for example, at about 25° C. In an embodiment of the present application, the encapsulating composition may be in a solventless type liquid phase. The encapsulating composition may be applied to sealing an organic electronic element, and specifically, may be applied to sealing the entire surface of the organic electronic element. As the encapsulating composition has a liquid form at room temperature, the present application can seal the organic electronic element by a method of applying the composition to the side of the element.

Also, the encapsulating composition of the present application may be an ink composition. The encapsulating composition of the present application may be an ink composition capable of an inkjet process. The encapsulating composition of the present application may have a specific composition and physical properties so that ink-jetting can be performed.

In one example, the encapsulating composition of the present application may have an amount of volatile organic compounds measured after curing of less than 50 ppm. The volatile organic compounds may be measured after curing the encapsulating composition and then holding a sample of the cured product at 110° C. for 30 minutes using Purge & Trap-gas chromatography/mass spectrometry. The measurement may be performed using a Purge & Trap sampler (JAI JTD-505 III)-GC/MS (Agilent 7890b/5977a) instrument.

Furthermore, in an embodiment of the present application, the encapsulating composition may have a viscosity in a range of 50 cPs or less, 1 to 46 cPs, or 5 to 44 cPs, as measured by Brookfield's DV-3 at a temperature of 25° C., a torque of 90% and a shear rate of 100 rpm. By controlling the viscosity of the composition within the above range, the present application can increase coating properties at the time of being applied to an organic electronic element to provide a sealing material of a thin film.

In one example, the encapsulating composition may have a surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

In an embodiment of the present application, the surface energy ($\gamma^{surface}$, mN/m) can be calculated as $\gamma^{surface} = \gamma^{dispersion} + \gamma^{polar}$. In one example, the surface energy can be measured using a drop shape analyzer (DSA100 product from KRUSS). For example, after an encapsulating composition for measuring the surface energy is applied on a SiNx substrate to a thickness of about 50 μm and a coating area of 4 cm² (width: 2 cm, height: 2 cm) to form a sealing layer (spincoater), it is dried at room temperature for about 10 minutes under a nitrogen atmosphere and then UV-cured with an intensity of 1000 mW/cm² through a light quantity of 4000mJ/cm². The process of dropping the deionized water whose surface tension is known on the film after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

Also, in an embodiment of the present application, the encapsulating composition may have a light transmittance of 90% or more, 92% or more, or 95% or more in the visible light region after curing. Within the above range, the present application provides an organic electronic device having high-resolution, low power consumption and long-life by applying the encapsulating composition to a top emission type organic electronic device. Furthermore, the encapsulating composition of the present application may have a haze of 3% or less, 2% or less or 1% or less according to JIS K7105 standard test after curing, and the lower limit is not particularly limited, but may be 0%. Within the haze range, the encapsulating composition may have excellent optical properties after curing. In this specification, the above-mentioned light transmittance or haze may be measured in a state where the encapsulating composition is cured to an organic layer, and may be optical characteristics measured when the thickness of the organic layer is any one thickness of 2 μm to 50 μm. In an embodiment of the present application, in order to realize the optical characteristics, the above-mentioned moisture adsorbent or inorganic filler may not be included.

Figure 1:
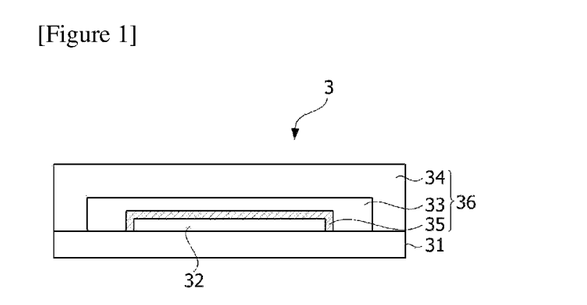
FIGS. 1 and 2 are cross-sectional views showing an organic electronic device according to one example of the present invention.

The present application also relates to an organic electronic device. As shown in FIG. 1, an exemplary organic electronic device (3) may comprise a substrate (31); an organic electronic element (32) formed on the substrate (31); and an organic layer (33) sealing the entire surface of the organic electronic element (32) and comprising the above-described encapsulating composition.

In an embodiment of the present application, the organic electronic element may comprise a first electrode layer, an organic layer formed on the first electrode layer and comprising at least a light emitting layer, and a second electrode layer formed on the organic layer. The first electrode layer may be a transparent electrode layer or a reflective electrode layer, and the second electrode layer may also be a transparent electrode layer or a reflective electrode layer. More specifically, the organic electronic element may comprise a reflective electrode layer formed on a substrate, an organic layer formed on the reflective electrode layer and comprising at least a light emitting layer, and a transparent electrode layer formed on the organic layer.

In the present application, the organic electronic element (23) may be an organic light emitting diode.

In one example, the organic electronic device according to the present application may be a top emission type, but is not limited thereto, and may be applied to a bottom emission type.

The organic electronic device may further comprise a protective layer (35) for protecting the electrodes and the light emitting layer of the element. The protective layer may be an inorganic protective layer (35). The protective layer may be a protective layer by chemical vapor deposition (CVD), where as the material, a known inorganic material may be used and for example, silicon nitride (SiNx) may be used. In one example, silicon nitride (SiNx) used as the protective layer can be deposited to a thickness of 0.01 μm to 5 μm.

In an embodiment of the present application, the organic electronic device (3) may further comprise an inorganic layer (34) formed on the organic layer (33). The material of the inorganic layer (34) is not limited, which may be the same as or different from the above-described protective layer. In one example, the inorganic layer may be one or more metal oxides or nitrides selected from the group consisting of Al, Zr, Ti, Hf, Ta, In, Sn, Zn and Si. The inorganic layer may have a thickness of 5 to 100 nm, 10 nm to 90 nm, or 10 to 80 nm. In one example, the inorganic layer of the present application may be an inorganic material without any dopant, or may be an inorganic material containing a dopant. The dopant which may be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the organic layer may have a thickness in a range of 2 μm to 20 μm, 2.5 μm to 15 μm, and 2.8 μm to 9 μm. The present application may provide a thin-film organic electronic device by providing a thin organic layer.

The organic electronic device (3) of the present application may comprise a sealing structure comprising the organic layer (33) and the inorganic layer (34), as described above, where the sealing structure may comprise at least one or more organic layers and at least one or more inorganic layers, and the organic layer and the inorganic layer may be repeatedly laminated. For example, the organic electronic device may have a structure of substrate/organic electronic element/protective layer/(organic layer/inorganic layer)n, where n may be a number in a range of 1 to 100. FIG. 1 is a cross-sectional view exemplarily showing a case where n is 1.

The organic layer (33) can seal the upper surface of the element (32), and can seal the side surfaces together as well as the upper surface. In one example, the organic electronic device (3) of the present application may further comprise a cover substrate present on the organic layer (33). The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Figure 2:
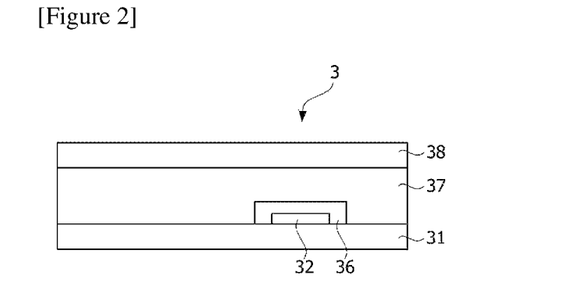

Also, as shown in FIG. 2, the organic electronic device (3) may further comprise a encapsulation film (37) existing between the cover substrate (38) and the substrate (31) on which the organic electronic element (32) is formed. The encapsulation film (37) may be applied as a use for attaching the substrate (31) on which the organic electronic element (32) is formed and the cover substrate (38), which may be, for example, a pressure-sensitive adhesive film or an adhesive film, but is not limited thereto. The encapsulation film (37) may seal the entire surface of the sealing structure (36) of the above-described organic layer and inorganic layer, laminated on the organic electronic element (32).

The present application also relates to a method for manufacturing an organic electronic device.

In one example, the manufacturing method may comprise a step of forming an organic layer (33) on a substrate (31) in which an organic electronic element (32) is formed on its upper part, so that the above-described encapsulating composition seals the entire surface of the organic electronic element (32).

Here, the organic electronic element (32) may be produced by forming a reflective electrode or a transparent electrode on a substrate (31) such as glass or a polymer film, as a substrate (31), by a method such as vacuum deposition or sputtering, and forming an organic material layer on the reflective electrode. The organic material layer may comprise a hole injecting layer, a hole transporting layer, a light emitting layer, an electron injecting layer, and/or an electron transporting layer. Subsequently, a second electrode is further formed on the organic material layer. The second electrode may be a transparent electrode or a reflective electrode.

The manufacturing method of the present application may further comprise a step of forming a protective layer (35) on the first electrode, the organic material layer and the second electrode, formed on the substrate (32). Then, the above-described organic layer (33) is applied to cover the entire surface of the organic electronic element (32) on the substrate (31). Here, the step of forming the organic layer (33) is not particularly limited and the above-described encapsulating composition may be applied to the entire surface of the substrate (31) using a process such as inkjet printing, gravure coating, spin coating, screen printing or reverse offset coating.

The manufacturing method may further comprise a step of irradiating the organic layer with light. In the present invention, a curing process may also be performed on an organic layer sealing an organic electronic device, and such a curing process may be performed, for example, in a heating chamber or a UV chamber, and preferably, may be performed in a UV chamber.

In one example, after the above-described encapsulating composition is applied to form an entire surface organic layer, the composition can be irradiated with light to induce cross-linking. The irradiation of light may comprise irradiating with light having a wavelength range of 250 nm to 450 nm or 300 nm to 450 nm region bands at a light quantity of 0.3 to 6 J/cm$^2$ or a light quantity of 0.5 to 5 J/cm$^2$.

In addition, the manufacturing method of the present application may further comprise a step of forming an inorganic layer (34) on the organic layer (33). As the step of forming an inorganic layer, a known method in the art may be used, which may be the same as or different from the above-described method of forming a protective layer.

Advantageous Effects

The present application provides an encapsulating composition which can effectively block moisture or oxygen introduced into an organic electronic device from the outside to secure the lifetime of the organic electronic device, is possible to realize a top emission type organic electronic device, is applicable to an inkjet method and can provide a thin display, and an organic electronic device comprising the same.

EXPLANATION OF REFERENCE NUMERALS

3: organic electronic device
31: substrate
32: organic electronic element
33: organic layer
34: inorganic layer 35: protective layer
36: sealing structure
37: encapsulation film
38: cover substrate

BEST MODE

Hereinafter, the present invention will be described in more detail through Examples according to the present invention and Comparative Examples not complying with the present invention, but the scope of the present invention is not limited by the following examples.

Example 1

An alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-121 from TOAGOSEI), as curable compounds, were introduced into a mixing vessel in a weight ratio of 16:18:18:39.95 (Celloxide2021P:DE200:o-cresyl glycidyl ether:OXT-121) at room temperature. 3.3 parts by weight of a photopolymerization initiator (Irgacure PAG 290 from BASF, hereinafter 1290), 1.1 parts by weight of a fluorine-based surfactant (F552 from DIC), 3.3 parts by weight of a coupling agent (KBM-303, SHIN-ETSU) and 0.05 parts by weight of a heat stabilizer, 2,6-di-tert-butyl-alpha-methoxy-para-cresol (SIGMA aldrich), relative to 100 pats by weight of the entire curable compound, were further introduced to the mixing vessel. Also, 33.3 parts by weight of a photosensitizer, 9,10-dibutoxyanthracene (DBA from SIGMA aldrich), relative to 100 parts by weight of the photopolymerization initiator was further introduced to the mixing vessel.

In the mixing vessel, a uniform encapsulating composition ink was prepared using a planetary mixer (Kurabo, KK-250s).

Example 2

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-121 from TOAGOSEI), as curable compounds, were introduced into a mixing vessel in a weight ratio of 16:16:20:39.95 (Celloxide2021P:DE200:o-cresyl glycidyl ether:OXT-121).

Example 3

An encapsulating composition was prepared in the same manner as in Example 1, except that an alicyclic epoxy compound (Celloxide 2021P, Daicel Corp.), an aliphatic epoxy compound of 1,6-hexanediol diglycidyl ether (SIGMA aldrich), a monofunctional curable compound of o-cresyl glycidyl ether (HAJIN CHEM TECH) and an oxetane group-containing curable compound (OXT-121 from TOAGOSEI), as curable compounds, were introduced into a mixing vessel in a weight ratio of 16:14:22:39.95 (Celloxide2021P:1,6-hexanediol diglycidyl ether:o-cresyl glycidyl ether:OXT-121).

Example 4

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-212 from TOAGOSEI), as curable compounds, were introduced into a mixing vessel in a weight ratio of 16:14:25:36.95 (Celloxide2021P:DE200:2-ethylhexyl glycidyl ether:OXT-212).

Example 5

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-212 from TOAGOSEI), as curable compounds, were introduced into a mixing vessel in a weight ratio of 15:10:20:46.95 (Celloxide2021P:DE200:o-cresyl glycidyl ether:OXT-212).

Example 6

An encapsulating composition was prepared in the same manner as in Example 1, except that an alicyclic epoxy compound (Celloxide 2021P, Daicel Corp.), an aliphatic epoxy compound of 1,6-hexanediol diglycidyl ether (SIGMA aldrich), a monofunctional curable compound of 2-ethylhexyl glycidyl ether (SIGMA aldrich) and an oxetane group-containing curable compound (OXT-121 from TOAGOSEI), as curable compounds, were introduced into a mixing vessel in a weight ratio of 16:5:25:45.95 (Celloxide2021P:1,6-hexanediol diglycidyl ether:2-ethylhexyl glycidyl ether:OXT-121).

Example 7

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-121 from TOAGOSEI), as curable compounds, were introduced into a mixing vessel in a weight ratio of 16:25:15:35.95 (Celloxide2021P:DE200:2-ethylhexyl glycidyl ether:OXT-121).

Example 8

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-121 from TOAGOSEI), as curable compounds, were introduced into a mixing vessel in a weight ratio of 16:30:15:30.95 (Celloxide2021P:DE200:2-ethylhexyl glycidyl ether:OXT-121).

Comparative Example 1

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-121 from TOAGOSEI), as curable compounds, were introduced into a mixing vessel in a weight ratio of 15:4:24:46.95 (Celloxide2021P:DE200:o-cresyl glycidyl ether:OXT-121).

Comparative Example 2

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-121 from TOAGOSEI), as curable compounds, were introduced into a mixing vessel in a weight ratio of 16:35:10:30.95 (Celloxide2021P:DE200:2-ethylhexyl glycidyl ether:OXT-121).

Comparative Example 3

An encapsulating composition was prepared in the same manner as in Example 1, except that an alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-212 from TOAGOSEI), as curable compounds, were introduced into a mixing vessel in a weight ratio of 15:0:25:51.95 (Celloxide2021P:DE200:o-cresyl glycidyl ether:OXT-212).

Comparative Example 4

An alicyclic epoxy compound (Celloxide 8010, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-121 from TOAGOSEI), as curable compounds, were introduced into a mixing vessel in a weight ratio of 20:10:10:52.45 (Celloxide8010:DE200:2-ethylhexyl glycidyl ether:OXT-121) at room temperature. 3.2 parts by weight of a photopolymerization initiator (I290), 1.1 parts by weight of a fluorine-based surfactant (F552 from DIC), 3.2 parts by weight of a coupling agent (KBM-303, SHIN-ETSU) and 0.05 parts by weight of a heat stabilizer, 2,6-di-tert-butyl-alpha-methoxy-para-cresol (SIGMA aldrich), relative to 100 pats by weight of the entire curable compound, were further introduced to the mixing vessel. Also, 16.7 parts by weight of a photosensitizer, 9,10-dibutoxyanthracene (DBA from SIGMA aldrich), relative to 100 parts by weight of the photopolymerization initiator was further introduced to the mixing vessel.

In the mixing vessel, a uniform encapsulating composition ink was prepared using a planetary mixer (Kurabo, KK-250s).

Comparative Example 5

An encapsulating composition was prepared in the same manner as in Comparative Example 4, except that an alicyclic epoxy compound (Celloxide 8010, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-212 from TOAGOSEI), as curable compounds, were introduced into a mixing vessel in a weight ratio of 17:10:7:58.45 (Celloxide8010:DE200:2-ethylhexyl glycidyl ether:OXT-212).

Comparative Example 6

An alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of 2-ethylhexyl glycidyl ether (SIGMA aldrich) and an oxetane group-containing curable compound (OXT-212 from TOAGOSEI), as curable compounds, were introduced into a mixing vessel in a weight ratio of 15:10:20:46.95 (Celloxide2021P:DE200:2-ethylhexyl glycidyl ether:OXT-212) at room temperature. 2.6 parts by weight of a photopolymerization initiator (I290), 1.1 parts by weight of a fluorine-based surfactant (F552 from DIC), 3.3 parts by weight of a coupling agent (KBM-303, SHIN-ETSU) and 0.05 parts by weight of a heat stabilizer, 2,6-di-tert-butyl-alpha-methoxy-para-cresol (SIGMA aldrich), relative to 100 pats by weight of the entire curable compound, were further introduced to the mixing vessel. Also, 41.7 parts by weight of a photosensitizer, 9,10-dibutoxyanthracene (DBA from SIGMA aldrich), relative to 100 parts by weight of the photopolymerization initiator was further introduced to the mixing vessel.

In the mixing vessel, a uniform encapsulating composition ink was prepared using a planetary mixer (Kurabo, KK-250s).

Comparative Example 7

An encapsulating composition was prepared in the same manner as in Comparative Example 6, except that 3.9 parts by weight of a photopolymerization initiator (I290), relative to 100 parts by weight of the entire curable compound, was introduced into the mixing vessel and 27.8 parts by weight of a photosensitizer, 9,10-dibutoxyanthracene (DBA from SIGMA aldrich), relative to 100 parts by weight of the photopolymerization initiator, was further introduced into the mixing vessel.

Comparative Example 8

An encapsulating composition was prepared in the same manner as in Comparative Example 6, except that 3.3 parts by weight of a photopolymerization initiator (I290), relative to 100 parts by weight of the entire curable compound, was introduced into the mixing vessel, 20 parts by weight of a photosensitizer, 9,10-dibutoxyanthracene (DBA from SIGMA aldrich), relative to 100 parts by weight of the photopolymerization initiator, was further introduced into the mixing vessel and a silicone-based surfactant (D8526 from BYK) was introduced thereto instead of F552 as a surfactant.

Comparative Example 9

An alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-212 from TOAGOSEI), as curable compounds, were introduced into a mixing vessel in a weight ratio of 22:25:35:9.95 (Celloxide2021P:DE200:o-cresyl glycidyl ether:OXT-212) at room temperature. 3.3 parts by weight of a photopolymerization initiator (Irgacure PAG 290 from BASF, hereinafter 1290), 1.1 parts by weight of a fluorine-based surfactant (F552 from DIC), 3.3 parts by weight of a coupling agent (KBM-303, SHIN-ETSU) and 0.05 parts by weight of a heat stabilizer, 2,6-di-tert-butyl-alpha-methoxy-para-cresol (SIGMA aldrich), relative to 100 pats by weight of the entire curable compound, were further introduced to the mixing vessel. Also, 33.3 parts by weight of a photosensitizer, 9,10-dibutoxyanthracene (DBA from SIGMA aldrich), relative to 100 parts by weight of the photopolymerization initiator was further introduced to the mixing vessel.

In the mixing vessel, a uniform encapsulating composition ink was prepared using a planetary mixer (Kurabo, KK-250s).

Comparative Example 10

An alicyclic epoxy compound (Celloxide 2021P, Daicel Corp.), an aliphatic epoxy compound of 1,4-butanediol diglycidyl ether (DE200, HAJIN CHEM TECH), a monofunctional curable compound of o-cresyl glycidyl ether (HAJIN CHEM TECH) and an oxetane group-containing curable compound (OXT-212 from TOAGOSEI), as curable compounds, were introduced into a mixing vessel in a weight ratio of 23:28:36:4.45 (Celloxide2021P:DE200:o-cresyl glycidyl ether:OXT-212) at room temperature. 3.8 parts by weight of a photopolymerization initiator (Irgacure PAG 290 from BASF, hereinafter 1290), 1.1 parts by weight of a fluorine-based surfactant (F552 from DIC), 3.3 parts by weight of a coupling agent (KBM-303, SHIN-ETSU) and 0.05 parts by weight of a heat stabilizer, 2,6-di-tert-butyl-alpha-methoxy-para-cresol (SIGMA aldrich), relative to 100 pats by weight of the entire curable compound, were further introduced to the mixing vessel. Also, 28.6 parts by weight of a photosensitizer, 9,10-dibutoxyanthracene (DBA from SIGMA aldrich), relative to 100 parts by weight of the photopolymerization initiator was further introduced to the mixing vessel.

In the mixing vessel, a uniform encapsulating composition ink was prepared using a planetary mixer (Kurabo, KK-250s).

Physical properties in Examples and Comparative Examples were evaluated in the following manner.

1. Haze Measurement

The encapsulating compositions prepared in Examples and Comparative Examples were each applied to an LCD glass (50 mm×50 mm×5 mm) substrate under the conditions of 2000 rpm and 10 seconds using a spin coater. The substrate applied by the composition was kept under a nitrogen atmosphere for 10 minutes, and then cured at an intensity of 1000 mW/cm$^2$ and a light quantity of 4000 mJ/cm$^2$. The haze degree of the cured sealing material was measured by a hazemeter (COH-400). The thickness of the sealing material was 20 μm, the reference was air, and if the value exceeded 3%, it was classified as a defect due to haze. Accordingly, it was represented as X in the case of more than 3% and as O in the case of 3% or less.

2. Spreadability Measurement

The encapsulating compositions prepared in Examples and Comparative Examples were each jetted using inkjet printing (Unijet Omnijet 200), and one drop size, in which the jetted composition was formed on a SiNx substrate, was evaluated. One drop was applied to the substrate and after 1 minute of leveling time, it was cured at an intensity of 1000 mW/cm$^2$ and a light quantity of 2000 mJ/cm$^2$, and then the pattern was observed. It was represented as O in the case where the one drop size, which was formed due to excellent spreadability of the composition of 10 pL, was 210 μm or more and as X in the case where it was less than 210 μm.

3. Evaluation of Adhesion

The encapsulating compositions prepared in Examples and Comparative Examples were each applied to an LCD glass (50 mm×50 mm×5 mm) substrate under the conditions of 2000 rpm and 10 seconds using a spin coater. The substrate applied by the composition was cured at an intensity of 1000 mW/cm$^2$ and a light quantity of 2000 mJ/cm$^2$ under an air atmosphere. The thickness of the cured sealing material was 20 μm, the cured sealing material was cross-cut thereon, and the adhesion degree was evaluated with 3M 810D tape. It was represented as O in the case where the adhesion between the sealing material and the lower substrate was 4B or more and as X in the case where it was 3B or less.

TABLE 1

| | Haze | Spreadability | Adhesion | Remark |
|---|---|---|---|---|
| Example 1 | O | O | O | — |
| Example 2 | O | O | O | — |
| Example 3 | O | O | O | — |
| Example 4 | O | O | O | — |
| Example 5 | O | O | O | — |
| Example 6 | O | O | O | — |
| Example 7 | O | O | O | — |
| Example 8 | O | O | O | — |
| Comparative Example 1 | X | O | X | — |
| Comparative Example 2 | X | X | X | — |
| Comparative Example 3 | X | O | X | — |
| Comparative Example 4 | O | O | X | — |
| Comparative Example 5 | X | X | X | — |
| Comparative Example 6 | X | O | — | — |
| Comparative Example 7 | X | O | — | — |
| Comparative Example 8 | X | O | O | — |
| Comparative Example 9 | X | O | X | — |
| Comparative Example 10 | X | O | X | — |

The invention claimed is:

1. An encapsulating composition comprising:
   a curable compound having a cyclic structure in its molecular structure and having at least two or more curable functional groups, and
   a monofunctional curable compound in an amount of 65 parts by weight to 165 parts by weight relative to 100 parts by weight of the curable compound having a cyclic structure,
   wherein the composition has a haze of 3% or less according to JIS K7105 standard test after curing, and
   wherein the encapsulating composition is an ink composition.

2. The encapsulating composition according to claim 1, further comprising a linear or branched aliphatic curable compound.

3. The encapsulating composition according to claim 2, wherein the aliphatic curable compound has at least two or more curable functional groups.

4. The encapsulating composition according to claim 2, wherein the aliphatic curable compound is comprised in an amount of 30 parts by weight to 200 parts by weight relative to 100 parts by weight of the curable compound having a cyclic structure.

5. The encapsulating composition according to claim 1, further comprising a curable compound having an oxetane group.

6. The encapsulating composition according to claim 5, wherein the curable compound having an oxetane group has at least two or more oxetane groups.

7. The encapsulating composition according to claim 5, wherein the curable compound having an oxetane group is comprised in an amount of 50 parts by weight to 150 parts by weight relative to 100 parts by weight of the curable compound having a cyclic structure and the monofunctional curable compound.

8. The encapsulating composition according to claim 1, wherein the curable functional group is one or more selected from a glycidyl group, an isocyanate group, a hydroxyl group, a carboxyl group, an amide group, an epoxide group, a sulfide group, an acetal group and a lactone group.

9. The encapsulating composition according to claim 1, wherein the compound having a cyclic structure in its molecular structure has ring constituent atoms in the molecular structure in a range of 3 to 10.

10. The encapsulating composition according to claim 1, further comprising a surfactant.

11. The encapsulating composition according to claim 10, wherein the surfactant comprises a polar functional group.

12. The encapsulating composition according to claim 10, wherein the surfactant comprises a fluorine-based compound.

13. The encapsulating composition according to claim 10, wherein the surfactant is comprised in an amount of 0.01 parts by weight to 10 parts by weight relative to 100 parts by weight of the entire curable compound.

14. The encapsulating composition according to claim 1, further comprising a photoinitiator.

15. The encapsulating composition according to claim 14, wherein the photoinitiator is comprised in an amount of 1 to 15 parts by weight relative to 100 parts by weight of the entire curable compound.

16. The encapsulating composition according to claim 14, further comprising a photosensitizer.

17. The encapsulating composition according to claim 16, wherein the photosensitizer is comprised in a range of 28 parts by weight to 40 parts by weight relative to 100 parts by weight of the photoinitiator.

18. An organic electronic device, comprising:
a substrate;
an organic electronic element formed on the substrate; and
an organic layer sealing the entire surface of the organic electronic element,
wherein the organic layer comprises the encapsulating composition according to claim 1.

19. A method for manufacturing an organic electronic device, comprising:
a step of forming an organic layer on a substrate in which an organic electronic element is formed on its upper part,
wherein the organic layer comprises the encapsulating composition of claim 1, so that the encapsulating composition seals the entire surface of the organic electronic element.

20. The method for manufacturing an organic electronic device according to claim 19, wherein the step of forming an organic layer comprises inkjet printing, gravure coating, spin coating, screen printing or reverse offset coating.

* * * * *